United States Patent
Harris et al.

(10) Patent No.: US 7,114,903 B2
(45) Date of Patent: Oct. 3, 2006

(54) APPARATUSES AND METHOD FOR TRANSFERRING AND/OR PRE-PROCESSING MICROELECTRONIC WORKPIECES

(75) Inventors: Randy A. Harris, Kalispell, MT (US); Kyle M. Hanson, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 379 days.

(21) Appl. No.: 10/621,037

(22) Filed: Jul. 15, 2003

(65) Prior Publication Data

US 2004/0049911 A1    Mar. 18, 2004

Related U.S. Application Data

(60) Provisional application No. 60/396,386, filed on Jul. 16, 2002.

(51) Int. Cl.
 *B65H 5/00* (2006.01)
(52) U.S. Cl. .................. 414/222.01; 414/217; 414/939
(58) Field of Classification Search ................ 414/217, 414/939, 937, 222.01, 222.04, 222.12, 226.02
See application file for complete search history.

(56) References Cited

U.S. PATENT DOCUMENTS

| | | |
|---|---|---|
| 1,526,644 A | 2/1925 | Pinney |
| 1,881,713 A | 10/1932 | Laukel |
| 2,256,274 A | 9/1941 | Friedrich |
| 3,968,885 A | 7/1976 | Hassan et al. |
| 4,046,105 A | 9/1977 | Gomez |
| 4,304,641 A | 12/1981 | Grandia et al. |
| 4,431,361 A | 2/1984 | Bayne |
| 4,449,885 A | 5/1984 | Hertel et al. |
| 4,495,453 A | 1/1985 | Inaba et al. |
| 4,566,847 A | 1/1986 | Maeda et al. |
| 4,634,503 A | 1/1987 | Nogavich |
| 4,648,944 A | 3/1987 | George et al. |
| 4,693,017 A | 9/1987 | Oehler et al. |
| 4,695,215 A * | 9/1987 | Jacoby et al. .......... 414/223.01 |
| 4,761,214 A | 8/1988 | Hinman |
| 4,800,818 A | 1/1989 | Kawaguchi et al. |
| 4,828,654 A | 5/1989 | Reed |
| 4,864,239 A | 9/1989 | Casarcia et al. |
| 4,902,398 A | 2/1990 | Homstad |
| 4,924,890 A | 5/1990 | Giles et al. |

(Continued)

FOREIGN PATENT DOCUMENTS

EP      0047132     7/1985

(Continued)

OTHER PUBLICATIONS

U.S. Appl. No. 60/206,663, filed May 24, 2000.

(Continued)

*Primary Examiner*—Donald Underwood
(74) *Attorney, Agent, or Firm*—Perkins Coie LLP

(57) ABSTRACT

An apparatus and method for handling and/or pre-processing microelectronic workpieces. In one embodiment, the apparatus includes an input/output station configured to removably receive a plurality of microelectronic workpieces at an input/output location, a transfer station, and a first transfer device that moves the microelectronic workpieces directly between the input/output location and the transfer station. A second transfer device moves the microelectronic workpieces directly from the transfer station to at least one process station. The transfer station can include a pre-process station configured to identify and/or align the microelectronic workpieces. The apparatus can further include a storage station configured to support a plurality of microelectronic workpieces and can be positioned to at least partially overlap the pre-process station.

42 Claims, 3 Drawing Sheets

U.S. PATENT DOCUMENTS

| | | |
|---|---|---|
| 4,949,671 A | 8/1990 | Davis et al. |
| 4,962,726 A | 10/1990 | Matsushita et al. |
| 4,988,533 A | 1/1991 | Freeman et al. |
| 5,000,827 A | 3/1991 | Schuster et al. |
| 5,026,239 A | 6/1991 | Chiba et al. |
| 5,051,988 A | 9/1991 | Kawahigashi et al. |
| 5,055,036 A | 10/1991 | Asano et al. |
| 5,061,144 A | 10/1991 | Akimoto et al. |
| 5,082,364 A | 1/1992 | Russell |
| 5,110,248 A | 5/1992 | Asano et al. |
| 5,125,784 A | 6/1992 | Asano |
| 5,128,912 A | 7/1992 | Hug et al. |
| 5,135,636 A | 8/1992 | Yee et al. |
| 5,138,973 A | 8/1992 | Davis et al. |
| 5,156,174 A | 10/1992 | Thompson et al. |
| 5,168,886 A | 12/1992 | Thompson et al. |
| 5,168,887 A | 12/1992 | Thompson et al. |
| 5,172,803 A | 12/1992 | Lewin |
| 5,174,045 A | 12/1992 | Thompson et al. |
| 5,178,639 A | 1/1993 | Nishi |
| 5,180,273 A | 1/1993 | Sakaya et al. |
| 5,183,377 A | 2/1993 | Becker et al. |
| 5,186,594 A | 2/1993 | Toshima et al. |
| 5,217,586 A | 6/1993 | Datta et al. |
| 5,222,310 A | 6/1993 | Thompson et al. |
| 5,227,041 A | 7/1993 | Brogden et al. |
| 5,232,511 A | 8/1993 | Bergman |
| 5,235,995 A | 8/1993 | Bergman et al. |
| 5,238,500 A | 8/1993 | Bergman |
| 5,252,137 A | 10/1993 | Tateyama et al. |
| 5,256,274 A | 10/1993 | Poris |
| 5,301,700 A | 4/1994 | Kamikawa et al. |
| 5,332,445 A | 7/1994 | Bergman |
| 5,344,491 A | 9/1994 | Katou |
| 5,368,711 A | 11/1994 | Poris |
| 5,376,176 A | 12/1994 | Kuriyama |
| 5,377,708 A | 1/1995 | Bergman et al. |
| 5,388,945 A | 2/1995 | Garric et al. |
| 5,442,416 A | 8/1995 | Tateyama et al. |
| 5,445,484 A | 8/1995 | Kato et al. |
| 5,460,478 A | 10/1995 | Akimoto et al. |
| 5,464,313 A | 11/1995 | Ohsawa |
| 5,500,081 A | 3/1996 | Bergman |
| 5,527,390 A | 6/1996 | Ono et al. |
| 5,544,421 A | 8/1996 | Thompson et al. |
| 5,571,325 A | 11/1996 | Ueyama et al. |
| 5,575,611 A | 11/1996 | Thompson et al. |
| 5,639,206 A | 6/1997 | Oda et al. |
| 5,658,387 A | 8/1997 | Reardon et al. |
| 5,660,517 A | 8/1997 | Thompson et al. |
| 5,664,337 A | 9/1997 | Davis et al. |
| 5,670,034 A | 9/1997 | Lowery |
| 5,678,320 A | 10/1997 | Thompson et al. |
| 5,681,392 A | 10/1997 | Swain |
| 5,684,713 A | 11/1997 | Asada et al. |
| 5,700,127 A | 12/1997 | Harada et al. |
| 5,723,028 A | 3/1998 | Poris |
| 5,746,565 A | 5/1998 | Tepolt |
| 5,754,842 A | 5/1998 | Minagawa |
| 5,762,444 A | 6/1998 | Giannelli |
| 5,762,751 A | 6/1998 | Bleck et al. |
| 5,772,386 A | 6/1998 | Mages et al. |
| 5,785,826 A | 7/1998 | Greenspan |
| 5,947,718 A | 9/1999 | Weaver |
| 5,980,706 A | 11/1999 | Bleck et al. |
| 5,985,126 A | 11/1999 | Bleck et al. |
| 5,989,397 A | 11/1999 | Laube et al. |
| 5,999,886 A | 12/1999 | Martin et al. |
| 6,004,828 A | 12/1999 | Hanson |
| 6,027,631 A | 2/2000 | Broadbent |
| 6,028,986 A | 2/2000 | Song |
| 6,030,208 A | 2/2000 | Williams et al. |
| 6,042,324 A | 3/2000 | Aggarwal et al. |
| 6,071,059 A | 6/2000 | Mages et al. |
| 6,074,544 A | 6/2000 | Reid et al. |
| 6,090,260 A | 7/2000 | Inoue et al. |
| 6,091,498 A | 7/2000 | Hanson et al. |
| 6,110,346 A | 8/2000 | Reid et al. |
| 6,151,532 A | 11/2000 | Barone et al. |
| 6,156,167 A | 12/2000 | Patton et al. |
| 6,159,354 A | 12/2000 | Contolini et al. |
| 6,162,344 A | 12/2000 | Reid et al. |
| 6,162,488 A | 12/2000 | Gevelber et al. |
| 6,168,695 B1 | 1/2001 | Woodruff et al. |
| 6,179,983 B1 | 1/2001 | Reid et al. |
| 6,188,323 B1 | 2/2001 | Rosenquist et al. |
| 6,193,859 B1 | 2/2001 | Contolini et al. |
| 6,199,301 B1 | 3/2001 | Wallace |
| 6,228,232 B1 | 5/2001 | Woodruff et al. |
| 6,234,738 B1 | 5/2001 | Kimata et al. |
| 6,270,306 B1 * | 8/2001 | Otwell et al. .......... 414/222.13 |
| 6,318,951 B1 | 11/2001 | Schmidt et al. |
| 6,322,112 B1 | 11/2001 | Duncan |
| 6,322,677 B1 | 11/2001 | Woodruff et al. |
| 6,342,137 B1 | 1/2002 | Woodruff et al. |
| 6,391,166 B1 | 5/2002 | Wang |
| 6,413,359 B1 | 7/2002 | Keller |
| 6,654,122 B1 | 11/2003 | Hanson |
| 6,672,820 B1 | 1/2004 | Hanson |
| 2002/0006322 A1 | 1/2002 | Perlov et al. |
| 2002/0008037 A1 | 1/2002 | Wilson et al. |
| 2002/0125141 A1 | 9/2002 | Wilson et al. |
| 2002/0139678 A1 | 10/2002 | Wilson et al. |
| 2002/0179863 A1 | 12/2002 | Harris et al. |

FOREIGN PATENT DOCUMENTS

| | | |
|---|---|---|
| EP | 0452939 | 10/1991 |
| EP | 0544311 | 6/1993 |
| EP | 0582019 | 2/1994 |
| GB | 2217107 A | 3/1989 |
| JP | 1048442 | 2/1989 |
| JP | 4144150 | 5/1992 |
| JP | 5146984 | 6/1993 |
| JP | 5211224 | 8/1993 |
| WO | WO-95/06326 | 3/1995 |
| WO | WO-00/02808 | 1/2000 |
| WO | WO-00/61498 | 10/2000 |
| WO | WO-00/61837 | 10/2000 |
| WO | WO-01/90434 | 11/2001 |
| WO | WO-02/097165 | 12/2002 |
| WO | WO-02/099165 | 12/2002 |

OTHER PUBLICATIONS

Lee, Tien-Yu Tom, et al., "Application of a CFD Rool in Designing a Fountain Plating Cell for Uniform Bump Plating of Semiconductor Wafers," IEEE Transactions on Components, Packaging and Manufacturing Technology, Part B., Feb. 1996, pp. 131-137, vol. 19, No. 1, IEEE.

Lowenheim, Frederick, A., "Electroplating," 1978, pp. 416-425, McGraw-Hill, Inc.

Ritter, G., "Two-and Three-Dimensional Numberical Modeling of Copper Electroplating for Advanced ULSI Metallization," Basic Models to Enhance Reliability, Jun. 1999, pp. 1-13, E-MRS Conference Symposium, France.

Semitool, Inc. VTP 1500 Vertical Furnance Brouchure, 1992, 1 pg.

SMIF-INX 2150/220/R150, http://www.asyst.com/prod/smif/smit_INS.html; 1 pg; 2001 Asyst Technologies [accessed Mar. 26, 2001}.

* cited by examiner

APPARATUSES AND METHOD FOR TRANSFERRING AND/OR PRE-PROCESSING MICROELECTRONIC WORKPIECES

CROSS-REFERENCE TO RELATED APPLICATIONS

This application claims benefit of U.S. Provisional Patent Application No. 60/396,386, filed Jul. 16, 2002, which is related to pending U.S. patent application Ser. No. 09/875,439 and Ser. No. 09/875,300, both filed Jun. 5, 2001 and both incorporated herein in their entireties by reference.

TECHNICAL FIELD

The present invention is directed toward apparatuses and methods for transferring microelectronic workpieces, for example, from one robot to another, and can include temporarily storing, identifying, aligning and/or otherwise pre-processing the workpieces prior to conducting subsequent processes.

BACKGROUND

Microelectronic devices, such as semiconductor devices and field emission displays, are generally fabricated on and/or in microelectronic workpieces using several different types of machines ("tools"). Many such machines have a single processing station that performs one or more procedures on the workpieces. Other processing machines have a plurality of processing stations that perform a series of different procedures on individual workpieces or batches of workpieces. In a typical fabrication process, one or more layers of conductive material are formed on the workpieces during the deposition stages. The workpieces are then typically subjected to etching and/or polishing procedures (i.e., planarization) to remove a portion of the deposited conductive layers for forming electrically isolated contacts and/or conductive lines.

Plating tools that plate metal or other materials on the workpieces are becoming an increasingly useful type of processing machine. Electroplating and electroless plating techniques can be used to deposit nickel, copper, solder, permalloy, gold, silver, platinum and other metals onto workpieces for forming blanket layers or patterned layers. A typical metal plating process involves depositing a seed layer onto the surface of the workpiece using chemical vapor deposition (CVD), physical vapor deposition (PVD), electroless plating processes or other suitable methods. After forming the seed layer, a blanket layer or patterned layer of metal is plated on the workpiece by applying an appropriate electrical potential between the seed layer and an electrode in the presence of an electrolytic solution. Alternatively, the blanket layer can be applied to the workpiece using electroless processing techniques. In either process, the workpiece is then cleaned, etched and/or annealed in subsequent procedures before transferring the workpiece to another processing machine.

The foregoing operations are typically conducted within a single enclosed clean or "mini" environment in a processing tool. In a typical arrangement, a plurality of individual workpieces are brought to the tool in a portable container which defines another clean mini environment. A door of the container is placed flush against a door of the tool, and both doors are opened together to reduce the likelihood for introducing contaminants into the enclosure surrounding the tool. The workpieces are then moved into the enclosure.

Prior to processing the workpieces within the enclosure, the workpieces are identified by scanning a code or other identifying characteristic on the workpieces, for example with a bar code reader or other optical character recognition (OCR) system. The workpieces can also be aligned, for example, when the scan code or other identifying characteristic is positioned at a predetermined position relative to a recognizable feature of the workpiece, such as a notch or flat edge. This prealignment technique can also be used to precisely position the workpiece for subsequent processes that require the workpiece to have a specific orientation.

One existing arrangement for carrying out the prealigning and identification functions described above is to have a single robot retrieve workpieces one by one from the portable workpiece container, place the workpieces in a pre-aligner device, and then move the workpieces to downstream process chambers. Another existing approach is to have one robot remove the workpieces one by one from the container, deliver the workpieces one by one to a prealigner, then move the workpieces one by one to a transfer station. A second robot retrieves the workpieces from the transfer station, moves the workpieces among the appropriate processing stations, and returns the workpieces to the transfer station when the processes are complete. The first robot then moves the processed workpieces one by one to the original container or another container.

One drawback with the foregoing multi-robot approach is that the first robot may not operate efficiently because it must move each workpiece twice (once to the prealigner and once to the transfer station) before the workpiece is handed off to the second robot. Another drawback with this approach is that the first robot cannot operate entirely independently of the second robot because once the transfer station is occupied by a workpiece, the first robot cannot deliver another workpiece to the transfer station until the first workpiece is removed by the second robot.

SUMMARY

The present invention is directed toward apparatuses and methods for handling microelectronic workpieces. One aspect of several embodiments of the invention includes a tool having an input/output station or location configured to removably receive microelectronic workpieces, and at least one process station configured to perform a selected process on the microelectronic workpieces. A first robot or other transfer device moves the microelectronic workpieces between the input/output location and a transfer station, and a second robot or transfer device moves the microelectronic workpieces from the transfer station to the process stations of the tool. Several embodiments of the invention are directed to improving the efficiency of the interaction between the first and second robots, for example, by providing the transfer station with a storage station that can carry multiple microelectronic workpieces awaiting pickup by the first robot and/or the second robot. In another aspect of the invention, the transfer station can include features that identify and/or align the microelectronic workpieces before they are processed. By combining these features in a single station, the footprint of the tool is reduced and the efficiency with which microelectronic workpieces are moved throughout the tool is improved.

In a particular embodiment, the apparatus includes a pre-process station configured to identify and/or align the microelectronic workpiece, and a storage station configured to carry a plurality of microelectronic workpieces. At least a portion of one of the pre-process station and the storage station overlaps at least a portion of the other. In a more particular embodiment, the storage station and the pre-process station support microelectronic workpieces coaxially. Accordingly, the first robot can position microelectronic workpieces at different locations along a single axis (instead of different locations along three axes), depending on whether the workpieces are to be pre-processed or temporarily stored.

A method in accordance with one aspect of the invention includes receiving a plurality of microelectronic workpieces at an input/output location of the process tool and transferring at least one of the microelectronic workpieces directly from the input/output location to a pre-process station with a first transfer device. The microelectronic workpiece is identified and/or aligned at the pre-process station, and then transferred directly to a process station with a second transfer device. In another aspect of the invention, a plurality of microelectronic workpieces can be positioned in a storage station for pickup and/or drop off by the first robot and/or the second robot.

DETAILED DESCRIPTION

The following description discloses the details and features of several embodiments of input/output stations, integrated tools and associated methods for handling and processing microelectronic workpieces. The term "microelectronic workpiece" is used throughout to include a workpiece formed from a substrate upon which and/or in which microelectronic circuits or components, data storage elements or layers, and/or micro-mechanical elements are fabricated. It will be appreciated that several of the details set forth below are provided to describe the following embodiments in a manner sufficient to enable a person skilled in the relevant art to make and use the disclosed embodiments. Several of the details and advantages described below, however, may not be necessary to practice certain embodiments of the invention. Additionally, the invention can include other embodiments that are within the scope of the claims but are not described in detail with respect to FIGS. 1–3.

Figure 1:
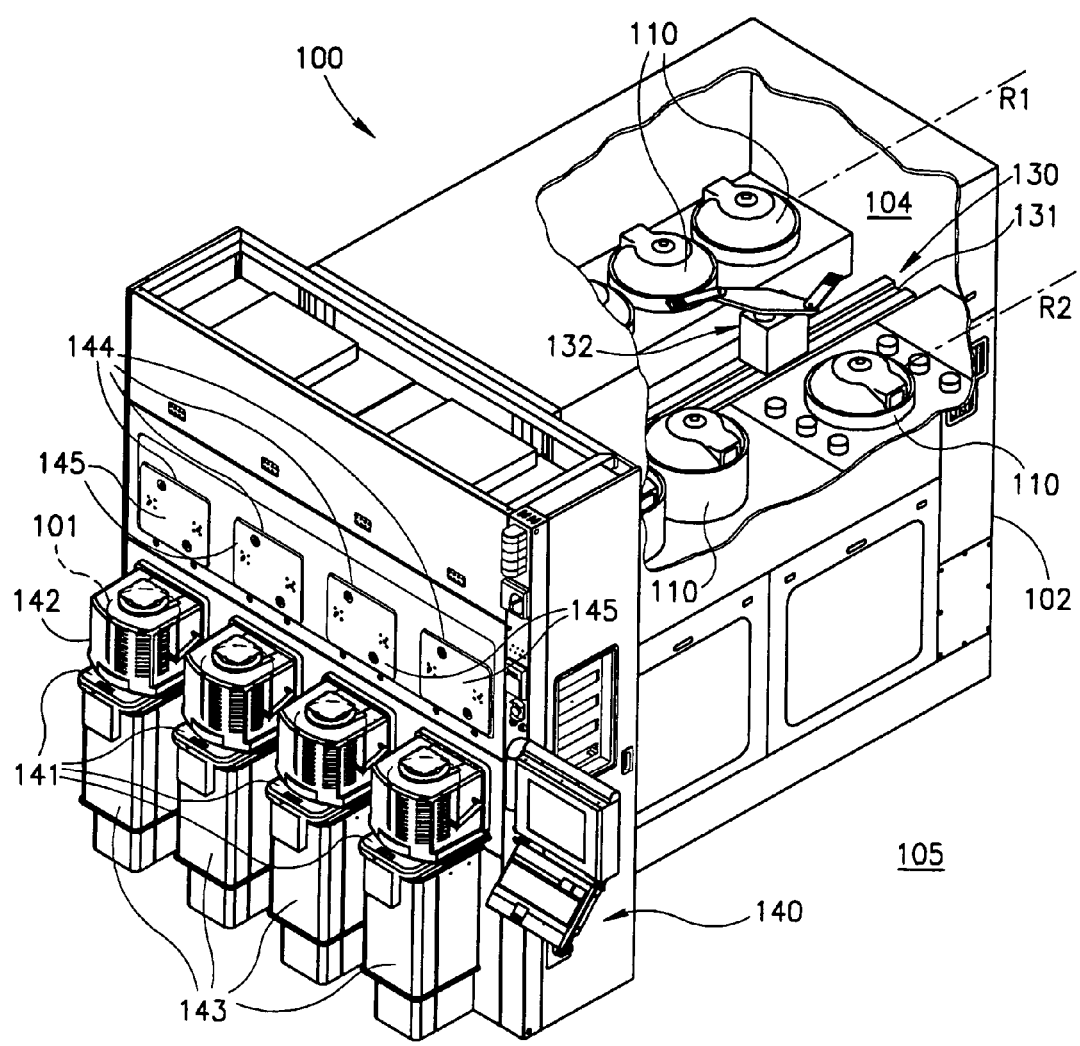
FIG. 1 is an isometric view of a processing tool having an input/output arrangement for handling microelectronic workpieces in accordance with an embodiment to the invention.

FIG. 1 is an isometric view of a processing tool or machine 100 having processing stations 110 and an input/output station 140 in accordance with an embodiment of the invention. A portion of the processing tool 100 is shown in cut-away view to illustrate selected internal components. In one aspect of this embodiment, the processing tool 100 includes a cabinet or enclosure 102 that at least partially isolates an interior region 104 from an exterior region 105. The enclosure 102 includes one or more apertures 144 and corresponding doors 145 (four of each are shown in FIG. 1) through which the microelectronic workpieces move between the exterior region 105 and the interior region 104 via the input/output station 140.

The input/output station 140 has one or more containers supports 141 (four are shown in FIG. 1) that are each housed in a protective shroud 143. The container supports 141 are configured to position workpiece containers 142 at an input/output location (such as the apertures 144) of the tool 100. The workpiece containers 142 each house a plurality of microelectronic workpieces 101 in a "mini" clean environment suitable for carrying the workpieces 101 through other environments that are not at clean room standards. In one embodiment, each of the workpieces containers 142 is accessible from the interior region 104 of the enclosure 102 through a corresponding one of the apertures 144 by opening the corresponding door 145. The workpieces 101 are then moved into the enclosure 102. In another embodiment, the microelectronic workpieces 101 can be introduced to the tool 100 via other input/output locations. For example, the microelectronic workpieces 101 can be introduced automatically through different types of openings from different types of workpiece containers 142, or the microelectronic workpieces 101 can be introduced manually. In any of these embodiments, once the workpieces 101 are inside the enclosure 102, they undergo processes at one or more of the processing stations 110.

In one embodiment, the processing stations 110 include clean/etch capsules, annealing stations, metrology stations, deposition stations, and/or other stations configured to perform processes associated with the fabrication of microelectronic devices and interconnecting circuitry. A process transfer device 130 moves the microelectronic workpieces 101 among the processing stations 110. In one aspect of this embodiment, the process transfer device 130 includes a linear track 131 extending in a lengthwise direction in the interior region 104 between the processing stations 110. The process transfer device 130 further includes a robot unit 132 supported by the track 131. In a particular embodiment shown in FIG. 1, a first set of processing stations 110 is arranged along a first row R1, and a second set of processing stations 110 is arranged along a second row R2. The linear track 131 extends between the first and second rows of processing stations 110, and the robot unit 132 is movable to access any of the processing stations along the track 131. When the microelectronic workpieces 110 are processed, the robot unit 132 returns them to the input/output station 140.

Figure 2:
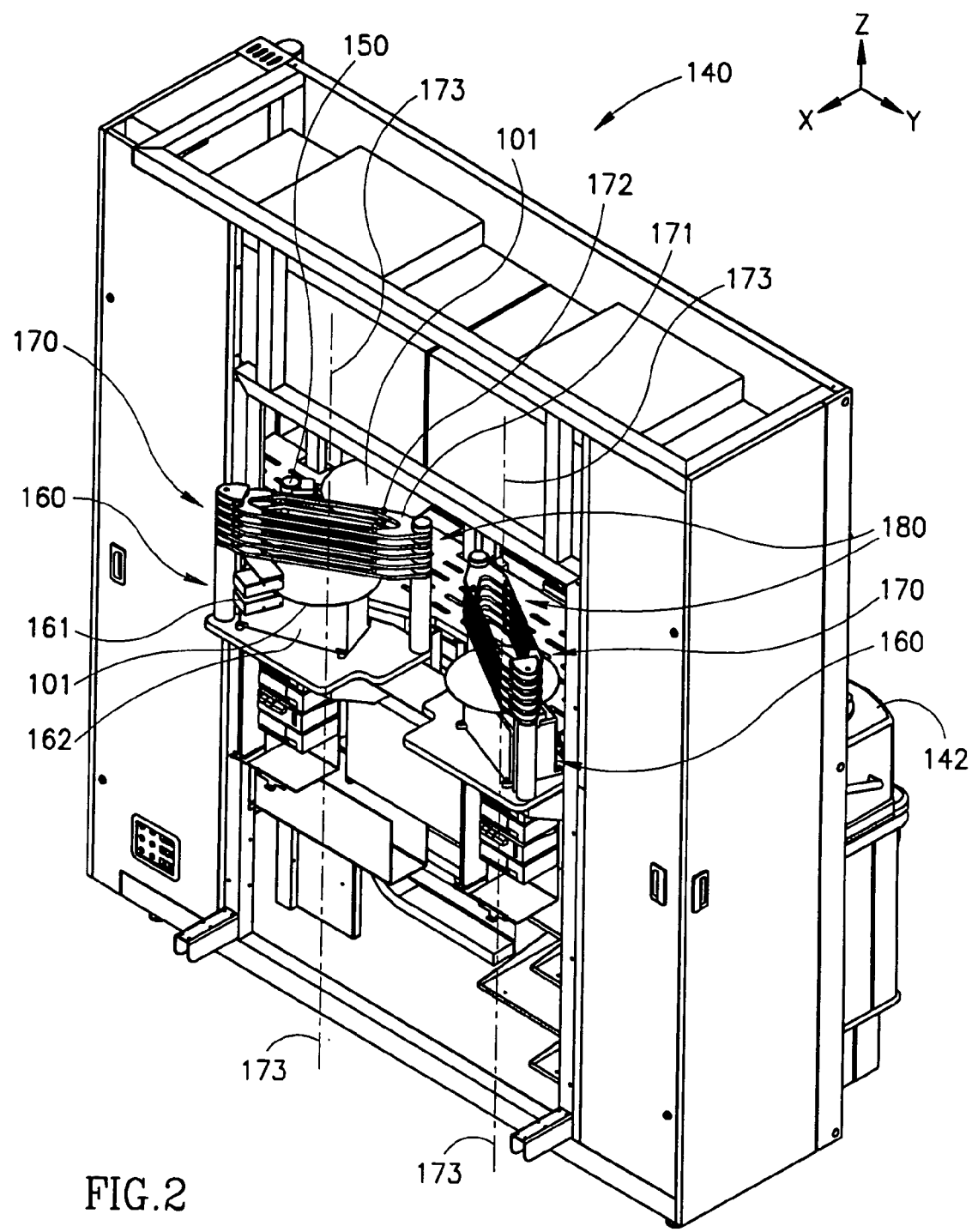
FIG. 2 is a rear isometric view of an embodiment of the input/output station shown in FIG. 1.

FIG. 2 is a rear isometric view of an embodiment of the input/output station 140 shown in FIG. 1. In one aspect of this embodiment, the input/output station 140 includes two transfer stations 180 and two corresponding input/output transfer devices 150, one of which is visible in FIG. 2. Each input/output transfer device 150 shuttles microelectronic workpieces 101 between the corresponding transfer station 180 and the workpiece containers 142. In one aspect of this embodiment, each input/output transfer device 150 has access to one of the transfer stations 180 and two of the workpiece containers 142. In other embodiments (for example, when the input/output station 140 is configured to handle more than or fewer than four workpiece containers 142 simultaneously), the input/output station 140 has other arrangements. For example, in some embodiments, the input/output station 140 includes other numbers of input/output transfer devices 150 and transfer stations 180. In any of these embodiments, the process transfer device 130 (FIG. 1) retrieves the microelectronic workpieces 101 from the transfer station(s) 180 for processing, and returns the microelectronic workpieces 101 to the transfer station(s) 180 after processing.

In one embodiment, each transfer station 180 includes a pre-process station 160 having an aligner 162. The aligner 162 includes a chuck or other support device that releasably carries one of the microelectronic workpiece 101 and rotates or otherwise changes the orientation of the microelectronic workpiece 101. An identifier 161 (such as an optical character recognition or OCR device) scans the microelectronic workpiece 101 as it moves. Accordingly, the identifier 161 (a) determines when the microelectronic workpiece 101 is in a selected orientation, and/or (b) determines the identity of the microelectronic workpiece 101. Suitable aligners 162 and identifiers 161 configured to carry out these functions are available from Genmark Automation, Inc. of Sunnyville, Calif.

In a further aspect of this embodiment, each transfer station 180 includes a storage station 170 at least proximate to the pre-process station 160. The storage station 170 is configured to releasably support a plurality of microelectronic workpieces 101. Accordingly, the input/output transfer device 150 and the process transfer device 130 (FIG. 1) are able to move the microelectronic workpieces 101 into and/or out of the transfer station 180 at different rates without delaying each other.

In one embodiment, each storage station 170 includes a plurality of workpiece supports 171. For example, in an embodiment shown in FIG. 2, each storage station 170 includes five workpiece supports 171, and in other embodiments, the storage stations 170 include other numbers of workpiece supports 171. In any of these embodiments, the workpiece supports 171 include support posts 172 or other devices that releasably carry the microelectronic workpieces 101. In one aspect of these embodiments, the support posts 172 or other devices support the peripheral edges of the microelectronic workpieces 101, and in other embodiments, the support posts 172 or other devices contact other parts of the workpieces 101.

In one embodiment, the storage station 170 is positioned above the pre-process station 160 along an axis 173. In another embodiment, the relative positions of the storage station 170 and the pre-process station 160 are reversed. The relative positions of these components may be selected based upon the expected use for the components. For example, when microelectronic workpieces 101 are typically moved directly from the workpiece containers 142 to the aligner 162, the aligner 162 is positioned beneath the storage station 170 because the workpieces 101 retrieved directly from the workpiece containers 142 are more likely than others to carry loose particles. By positioning the aligner 162 beneath the storage station 170, loose particles falling from a microelectronic workpiece 101 in the aligner 162 are less likely to contaminate other microelectronic workpieces, such as those positioned (above) in the storage station 170.

Figure 3:
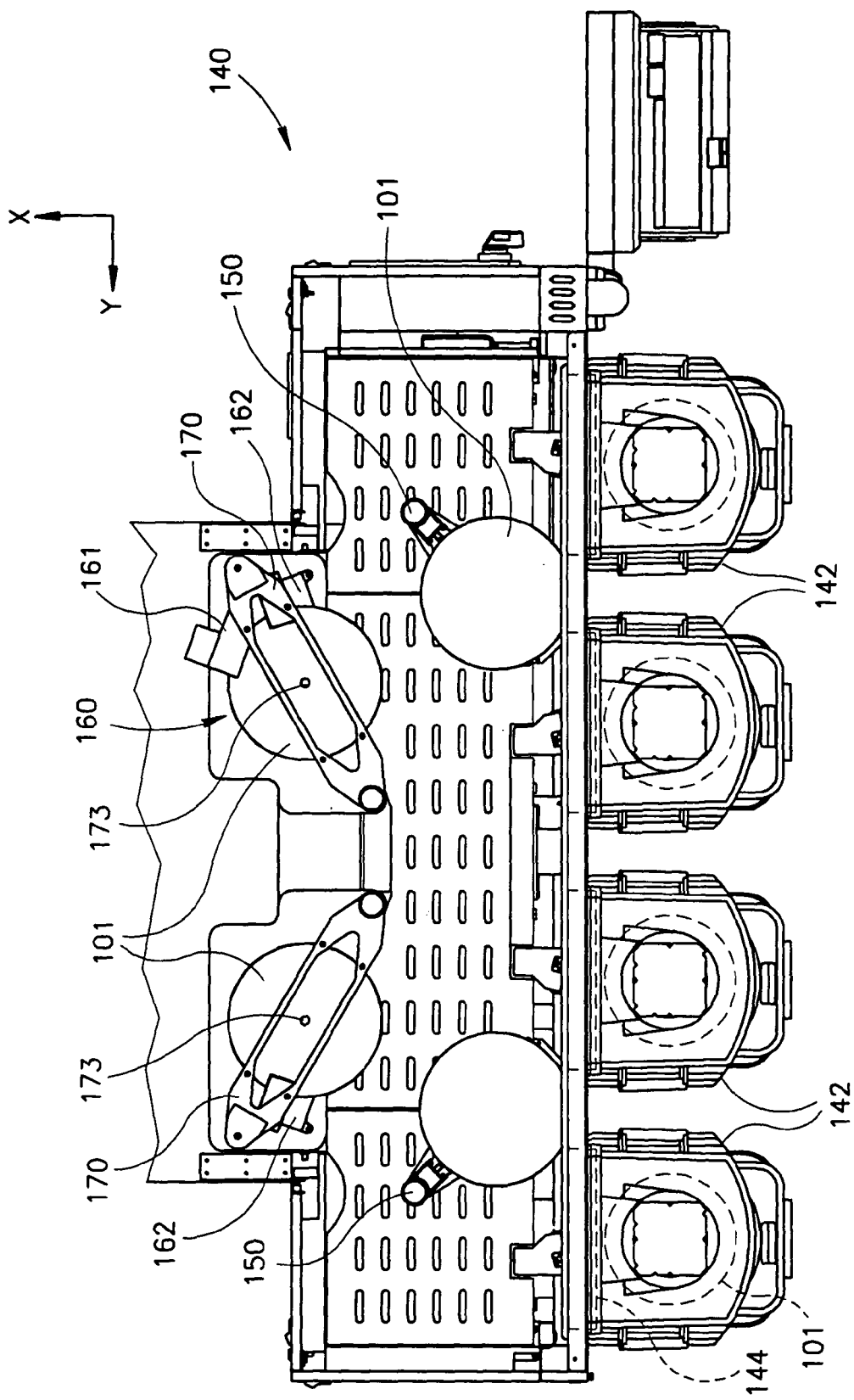
FIG. 3 is a top plan view of an embodiment of the input/output station shown in FIG. 1.

FIG. 3 is a top plan view of an embodiment of the input/output station 140 described above with reference to FIGS. 1 and 2. As shown in FIG. 3, the aligner 162 and the storage station 170 are coaxial in one aspect of this embodiment. For example, microelectronic workpieces 101 positioned in the aligner 162 are centered on the same axis 173 as microelectronic workpieces 101 positioned in the storage station 170. Accordingly, the axis 173 extends generally perpendicular to the plane of workpieces 101 positioned in both the aligner 162 and the storage station 170. An advantage of this arrangement is that each input/output transfer device 150 is configured to deliver all the microelectronic workpieces 101 to a single location in the XY plane. Accordingly, the only variable to be determined when positioning a microelectronic workpiece 101 at the transfer station 180 is which Z location (along the axis 173) the microelectronic workpiece 101 is destined for. As a result, the input/output transfer device 150 and/or the instructions required to operate the input/output transfer device 150 are simpler when compared with an arrangement in which the destination for each microelectronic workpiece 101 can have any of a wide variety of coordinates in three-dimensional space.

The operation of the tool 100 in accordance with several embodiments of the invention is described below with reference to FIGS. 1–3. In one embodiment, each input/output transfer device 150 retrieves each microelectronic workpiece 101 from a corresponding one of the workpiece containers 142 and delivers the microelectronic workpiece 101 directly to the aligner 162. After the microelectronic workpiece 101 has been aligned and/or identified, the process transfer device 130 retrieves the microelectronic workpiece 101 directly from the aligner 162 and routes the workpiece 101 to one or more of the processing stations 110. When the microelectronic workpiece 101 has been processed, the process transfer device 130 returns the microelectronic workpiece 101 to the storage station 170. The input/output transfer device 150 retrieves the microelectronic workpiece 101 from the storage station 170 and returns it to the same or a different workpiece container 142.

In another embodiment, for example when the microelectronic workpieces 101 are removed from the containers 142 and aligned/identified more quickly than they are processed in the process stations 110, the input/output transfer device 150 first positions the microelectronic workpieces 101 in the aligner 162 and then moves the microelectronic workpieces 101 to the storage station 170, where they are later retrieved by the process transfer device 130.

In a method in accordance with still another embodiment (for example, when the pre-process station 160 does not include an aligner 162 or identifier 161, or where the functions provided by these devices are unnecessary), the input/output transfer device 150 positions the microelectronic workpieces 101 directly in the storage station 170. Accordingly, the pre-process station 160 can be deactivated or eliminated from the tool 100. The process transfer device 130 then retrieves the microelectronic workpieces 101 directly from the storage station 170, and returns the processed microelectronic workpieces 101 back to the storage station 170.

As described above, one advantage of an embodiment of the tool 100 is that the input/output transfer device 150 moves microelectronic workpieces to the same point in the XY plane at the transfer station 180, whether the microelectronic workpieces 101 are positioned in the storage station 170 or the pre-process station 160. Another advantage of an embodiment of the apparatus 100 is that the microelectronic workpieces 101 are retrieved directly from the aligner 162 by the process transfer device 130. This is unlike some existing arrangements in which the microelectronic workpiece 101 must be moved by an input/output robot first to an alignment device and then to a handoff station before being retrieved by the process robot.

Another feature of an embodiment of the tool 100 described above with reference to FIGS. 1–3 is that the pre-process station 160 and the storage station 170 at least partially overlap each other. Accordingly, the respective footprints of each of these devices (i.e., the outline of the devices projected into the XY plane) also overlap each other, and the combined footprint of the two devices is reduced compared to an arrangement in which these devices are merely adjacent to each other or spaced apart laterally from each other. An advantage of this arrangement is that the overall footprint of the tool 100 can be reduced, which in turn reduces the operating cost of the tool 100 by reducing the amount of clean room floor space occupied by the tool 100.

From the foregoing, it will be appreciated that specific embodiments of the invention have been described herein for purposes of illustration, but that various modifications may be made without deviating from the spirit and scope of the invention. For example, in one embodiment, the microelectronic workpieces 101 are identified without being aligned. Accordingly, the pre-process station 160 includes an identifier 161, but not an aligner 162. In further embodiments, the pre-process station 160 is eliminated. In these embodiments, the input/output transfer device 150 moves the microelectronic workpieces 101 directly to the storage station 170, where the process transfer device 130 retrieves the microelectronic workpieces 101 for processing. Accordingly, the invention is not limited except as by the appended claims.

We claim:

1. An apparatus for handling microelectronic workpieces, comprising:
   an input/output station configured to removably receive microelectronic workpieces at an input/output location;
   a pre-process station configured to identify and/or align the microelectronic workpieces, the pre-process station including a first workpiece support positioned to carry a microelectronic workpiece;
   a storage station having a plurality of second workpiece supports, with each second workpiece support being positioned to carry a microelectronic workpiece before processing, after processing or both before and after processing, wherein the first and second workpiece supports are positioned to support coaxially located microelectronic workpieces;
   at least one process station spaced apart from the pre-process station and the input/output station;
   a first transfer device movably positioned proximate to the input/output station, the first transfer device being configured to move the microelectronic workpieces directly between the input/output location and the pre-process station; and
   a second transfer device movably positioned proximate to the at least one process station, the second transfer device being configured to move the microelectronic workpieces directly between the pre-process station and the at least one process station.

2. The apparatus of claim 1, further comprising an enclosure having at least one aperture and being disposed at least partially around the at least one process station, and wherein the input/output station is configured to receive microelectronic workpieces through the at least one aperture in the enclosure.

3. The apparatus of claim 1 wherein the first transfer device includes a first automatic robot and the second transfer device includes a second automatic robot.

4. The apparatus of claim 1, further comprising a storage station having a plurality of workpiece supports, with each workpiece support being positioned to carry a microelectronic workpiece before processing, after processing or both before and after processing, wherein at least a portion of one of the pre-process station and the storage station overlaps at least a portion of the other of the pre-process station and the storage station.

5. The apparatus of claim 1, further comprising a storage station having a plurality of workpiece supports, with each workpiece support being positioned to carry a microelectronic workpiece before processing, after processing or both before and after processing, and wherein the storage station and the pre-process station together form a transfer station.

6. The apparatus of claim 1 wherein the input/output station includes a plurality of container supports, with each container support configured to releasably carrier a container of microelectronic workpieces.

7. The apparatus of claim 1 wherein the pre-process station is one of at least two pre-process stations, and wherein the first transfer device is one of at least two first transfer devices.

8. The apparatus of claim 1 wherein the pre-process station includes a sensor positioned to detect an identifying characteristic of the microelectronic workpieces.

9. The apparatus of claim 1 wherein the at least one process station is configured to apply a conductive material to the microelectronic workpieces.

10. The apparatus of claim 1 wherein the at least one process station includes at least one of a metrology station, a material application station, a cleaning station, an etching station and an annealing station.

11. An apparatus for processing microelectronic workpieces, comprising:
    at least one process station configured to carry a microelectronic workpiece during processing;
    a pre-process station configured to identify and/or align the microelectronic workpiece, the pre-process station including a first workpiece support positioned to carry a microelectronic workpiece; and
    a storage station having a plurality of second workpiece supports, with each second workpiece support being positioned to carry a microelectronic workpiece before processing, after processing or both before and after processing, wherein the first and second workpiece supports are positioned to support coaxially located microelectronic workpieces.

12. The apparatus of claim 11 wherein each workpiece support includes a plurality of support posts, and wherein each support post includes a contact surface positioned to contact a peripheral region of the microelectronic workpiece.

13. The apparatus of claim 11, further comprising:
    an enclosure having at least one aperture and being disposed at least partially around the at least one process station; and
    an input/output station configured to receive microelectronic workpieces through the at least one aperture in the enclosure.

14. The apparatus of claim 11, further comprising:
    an input/output station configured to removably receive a plurality of microelectronic workpieces at an input/output location;
    a first transfer device movably positioned proximate to the input/output station, the first transfer device being configured to move the microelectronic workpieces directly between the input/output location and the pre-process station; and
    a second transfer device movably positioned proximate to the at least one process station, the second transfer device being configured to move the microelectronic workpieces directly between the pre-process station and the at least one process station.

15. The apparatus of claim 11 wherein the pre-process station is one of at least two pre-process stations and wherein the storage station is one of at least two storage stations.

16. The apparatus of claim 11 wherein the pre-process station includes a sensor positioned to detect an identifying characteristic of the microelectronic workpiece.

17. The apparatus of claim 11 wherein the at least one process station is configured to apply a conductive material to the microelectronic workpiece.

18. An apparatus for handling microelectronic workpieces, comprising:
   at least one process station configured to carry a microelectronic workpiece during processing;
   a pre-process station configured to identify and/or align microelectronic workpieces at a first workpiece location with the microelectronic workpieces in a first workpiece plane; and
   a storage station having a plurality of workpiece supports, each positioned to carry a microelectronic workpiece in a corresponding second workpiece location with the microelectronic workpiece in a second workpiece plane before processing, after processing or both before and after processing the microelectronic workpiece, wherein the first and second workpiece locations are coaxial along an axis generally normal to at least one of the workpiece planes.

19. The apparatus of claim 18 wherein the workpiece supports are first workpiece supports positioned to carry a first microelectronic workpiece centered on the axis, and wherein the pre-process station includes a second workpiece support configured to carry a second microelectronic workpiece centered on the axis.

20. The apparatus of claim 18 wherein each workpiece support includes a plurality of support posts, and wherein each support post includes a contact surface positioned to contact a peripheral region of the microelectronic workpiece.

21. The apparatus of claim 18, further comprising:
   an enclosure disposed at least partially around the at least one process station; and
   an input/output station configured to receive microelectronic workpieces through an aperture in the enclosure.

22. The apparatus of claim 18, further comprising:
   an input/output station configured to removably receive microelectronic workpieces at an input/output location;
   a first transfer device movably positioned proximate to the input/output station, the first transfer device being configured to move the microelectronic workpieces directly between the input/output location and the pre-process station; and
   a second transfer device movably positioned proximate to the at least one process station, the second transfer device being configured to move the microelectronic workpieces directly between the pre-process station and the at least one process station.

23. The apparatus of claim 18 wherein the pre-process station is one of at least two pre-process stations and wherein the storage station is one of at least two storage stations.

24. The apparatus of claim 18 wherein the pre-process station includes a sensor positioned to detect an identifying characteristic of the microelectronic workpiece.

25. The apparatus of claim 18 wherein the at least one process station is configured to apply a conductive material to the microelectronic workpiece.

26. An apparatus for handling microelectronic workpieces, comprising:
   at least one process station configured to carry a microelectronic workpiece during processing;
   a pre-process station configured to identify and/or align microelectronic workpieces, the pre-process station having a first footprint; and
   a storage station having a plurality of workpiece supports, with each workpiece support being positioned to carry a microelectronic workpiece before processing, after processing or both before and after processing the microelectronic workpiece, the storage station having a second footprint, wherein at least a portion of at least one of the first and second footprints overlaps at least a portion of the other of the first and second footprints and wherein the workpiece supports are first workpiece supports positioned to carry first microelectronic workpieces centered on an axis, further wherein the pre-process station includes a second workpiece support configured to carry a second microelectronic workpiece centered on the same axis.

27. The apparatus of claim 26 wherein each workpiece support includes a plurality of support posts, and wherein each support post includes a contact surface positioned to contact a peripheral region of the microelectronic workpiece.

28. The apparatus of claim 26, further comprising:
   an enclosure disposed at least partially around the at least one process station; and
   an input/output station configured to receive microelectronic workpieces through an aperture in the enclosure.

29. The apparatus of claim 26, further comprising:
   an input/output station configured to removably receive microelectronic workpieces at an input/output location;
   a first transfer device movably positioned proximate to the input/output station, the first transfer device being configured to move the microelectronic workpieces directly between the input/output location and the pre-process station; and
   a second transfer device movably positioned proximate to the at least one process station, the second transfer device being configured to move the microelectronic workpieces directly between the pre-process station and the at least one process station.

30. The apparatus of claim 26 wherein the pre-process station is one of at least two pre-process stations and wherein the storage station is one of at least two storage stations.

31. The apparatus of claim 26 wherein the pre-process station includes a sensor positioned to detect an identifying characteristic of the microelectronic workpiece.

32. The apparatus of claim 26 wherein the at least one process station is configured to apply a conductive material to the microelectronic workpiece.

33. An apparatus for handling microelectronic workpieces, comprising:
   at least one process station configured to carry a microelectronic workpiece during processing;
   a pre-process station configured to identify and/or align microelectronic workpieces, the pre-process station having a first footprint; and
   a storage station having a plurality of workpiece supports, with each workpiece support being positioned to carry a microelectronic workpiece before processing, after processing or both before and after processing the microelectronic workpiece, the storage station having a second footprint, wherein at least a portion of at least one of the first and second footprints overlaps at least a portion of the other of the first and second footprints, and wherein the workpiece supports are first workpiece supports positioned to carry first microelectronic workpieces centered on an axis, further wherein the pre-process station includes a second workpiece support configured to carry a second microelectronic workpiece centered on the same axis.

34. The apparatus of claim 33 wherein each workpiece support includes a plurality of support posts, and wherein each support post includes a contact surface positioned to contact a peripheral region of the microelectronic workpiece.

35. The apparatus of claim 33 wherein the pre-process station is one of at least two pre-process stations and wherein the storage station is one of at least two storage stations.

36. The apparatus of claim 33 wherein the pre-process station includes a sensor positioned to detect an identifying characteristic of the microelectronic workpiece.

37. The apparatus of claim 33 wherein the at least one process station is configured to apply a conductive material to the microelectronic workpiece.

38. An apparatus for handling microelectronic workpieces, comprising:
   an input/output station configured to removably receive microelectronic workpieces at an input/output location;
   a storage station spaced apart from the input/output location and configured to carry a plurality of microelectronic workpieces, the storage station including a plurality of first workpiece supports positioned to carry a plurality of microelectronic workpieces;
   at least one process station spaced apart from the storage station and the input/output station;
   a pre-process station configured to identify and/or align a microelectronic workpiece, the pre-process station further having a second workpiece support, and wherein the first and second workpiece supports are positioned to carry microelectronic workpieces coaxially;
   a first transfer device movably positioned proximate to the input/output station, the first transfer device being configured to move the microelectronic workpieces directly between the input/output location and the storage station; and
   a second transfer device movably positioned proximate to the at least one process station, the second transfer device being configured to move the microelectronic workpieces directly between the storage station and the at least one process station.

39. The apparatus of claim 38, further comprising an enclosure having at least one aperture and being disposed at least partially around the at least one process station, and wherein the input/output station is configured to receive microelectronic workpieces through at least one aperture in the enclosure.

40. The apparatus of claim 38 wherein the first transfer device includes a first automatic robot and the second transfer device includes a second automatic robot.

41. The apparatus of claim 38, further comprising a pre-process station configured to carry a microelectronic workpiece and identify and/or align the microelectronic workpiece, wherein at least a portion of one of the pre-process station and the storage station overlaps the other of the pre-process station and the storage station.

42. The apparatus of claim 38 wherein the at least one process station is configured to apply a conductive material to the microelectronic workpiece.

* * * * *